US011233206B2

(12) United States Patent
Chen et al.

(10) Patent No.: US 11,233,206 B2
(45) Date of Patent: Jan. 25, 2022

(54) PHOSPHORESCENT PTAG2 COMPLEX, PREPARATION METHOD THEREFOR AND USE THEREOF

(71) Applicant: Fujian Institute of Research on the Structure of Matter, Chinese Academy of Sciences, Fujian (CN)

(72) Inventors: Zhongning Chen, Fujian (CN); Huixing Shu, Fujian (CN); Jinyun Wang, Fujian (CN)

(73) Assignee: Fujian Institute of Research on the Structure of Matter, Chinese Academy of Sciences, Fujian (CN)

( * ) Notice: Subject to any disclaimer, the term of this patent is extended or adjusted under 35 U.S.C. 154(b) by 354 days.

(21) Appl. No.: 16/469,896

(22) PCT Filed: Sep. 20, 2017

(86) PCT No.: PCT/CN2017/102504
§ 371 (c)(1),
(2) Date: Jun. 14, 2019

(87) PCT Pub. No.: WO2018/107841
PCT Pub. Date: Jun. 21, 2018

(65) Prior Publication Data
US 2019/0319200 A1 Oct. 17, 2019

(30) Foreign Application Priority Data

Dec. 14, 2016 (CN) .......................... 201611155024.X

(51) Int. Cl.
*H01L 51/00* (2006.01)
*C07F 15/00* (2006.01)
(Continued)

(52) U.S. Cl.
CPC ...... *H01L 51/0091* (2013.01); *C07F 15/0086* (2013.01); *C09K 11/02* (2013.01);
(Continued)

(58) Field of Classification Search
CPC ............... H01L 51/0091; H01L 51/009; C07F 15/0086; C09K 2211/185
See application file for complete search history.

(56) References Cited

U.S. PATENT DOCUMENTS

2009/0198069 A1* 8/2009 Umakoshi ........... H01L 51/0087
548/101
2010/0010231 A1* 1/2010 Umakoshi .............. C09K 11/06
548/101
(Continued)

FOREIGN PATENT DOCUMENTS

| CN | 104892685 A | 9/2015 |
| CN | 105481910 A | 4/2016 |
| CN | 106632514 A | 5/2017 |

OTHER PUBLICATIONS

Shu, Hui-Xing et al."Photophysical and Electrominescent Properties of PtAg2 Acetylide Complexes Supported with meso- and rac-Tetraphosphine" Inorganic Chemistry, 2017, p. 9461-9473, vol. 56, ACS Publications, State Key Laboratory of Structural Chemistry, Fujian Institute of Research on the Structure of Matter, Chinese Academy of Sciences, 155 Yangqiao Road West, Fuzhou 350002, China, DOI: 10.1021/acs.inorgchem.7b00452.
(Continued)

*Primary Examiner* — Alexander C Kollias
(74) *Attorney, Agent, or Firm* — Novick, Kim & Lee, PLLC; Allen Xue

(57) ABSTRACT

Provided is an ionic type phosphorescent metal complex with a racemization structure, a preparation method therefor
(Continued)

and a use thereof. The structure of the complex is $[PtAg_2\{rac\text{-}(PPh_2CH_2PPhCH_2-)_2\}(C\equiv CR)_2(PR'_3)_2]^{2+} A''^{n-}{}_{2/n}$ or $[PtAg_2\{meso\text{-}(PPh_2CH_2PPhCH_2-)_2\}(C\equiv CR)_2(PR'_3)(\mu\text{-}X)]^+{}_m A^{m-}$, wherein R is the same or different and is independently selected from alkyl, aryl, heteroaryl, and heteroaryl aryl; R' is the same or different and is independently selected from alkyl, aryl, and heteroaryl; the alkyl, aryl, and heteroaryl can be substituted by one or more substituents which are selected from alkyl, alkenyl, alkynyl, alkoxy, amino, halogen, halogenated alkyl, and aryl; X is halogen; $A^{m-}$ and $A^{n-}$ are monovalent or bivalent anions; and m or n is 1 or 2. The present invention also relates to an organic light emitting diode, a preparation method therefor and use thereof. The organic light emitting diode prepared by taking the phosphorescent metal complex of the present invention as a luminous layer dopant has high-performance organic electroluminescence and can be applied to panel display.

14 Claims, 1 Drawing Sheet

(51) Int. Cl.
*C09K 11/02* (2006.01)
*C09K 11/06* (2006.01)
*H01L 51/50* (2006.01)

(52) U.S. Cl.
CPC ............ *C09K 11/06* (2013.01); *H01L 51/009* (2013.01); *C09K 2211/1007* (2013.01); *C09K 2211/1014* (2013.01); *C09K 2211/185* (2013.01); *H01L 51/5016* (2013.01)

(56) References Cited

U.S. PATENT DOCUMENTS

2011/0108769 A1* 5/2011 Yersin .................. H01L 51/009
252/301.16
2014/0186984 A1* 7/2014 Wesemann .............. H01L 51/50
438/46

OTHER PUBLICATIONS

Zhang, Li-Yi et al. "Spectroscopic and Phosphorescent Modulation in Triphosphine-Supported PtAg2 Heterotrinuclear Alkynyl Complexes", Inorganic Chemistry, 2013, p. 5167-5175, vol. 52, ACS Publications, State Key Laboratory of Structural Chemistry, Fujian Institute of Research on the Structure of Matter, Chinese Academy of Sciences,155 Yangqiao Road West, Fuzhou 350002, China, dx.doi.org/10.1021/ic4000457.

* cited by examiner

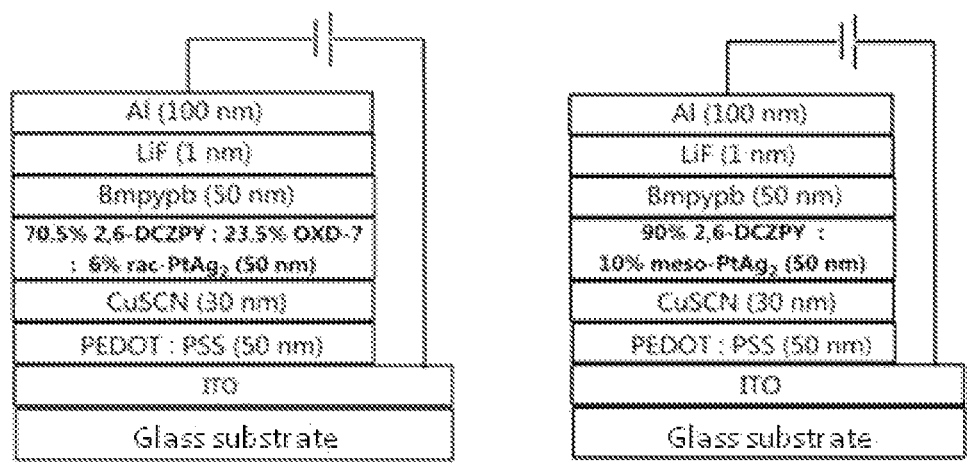
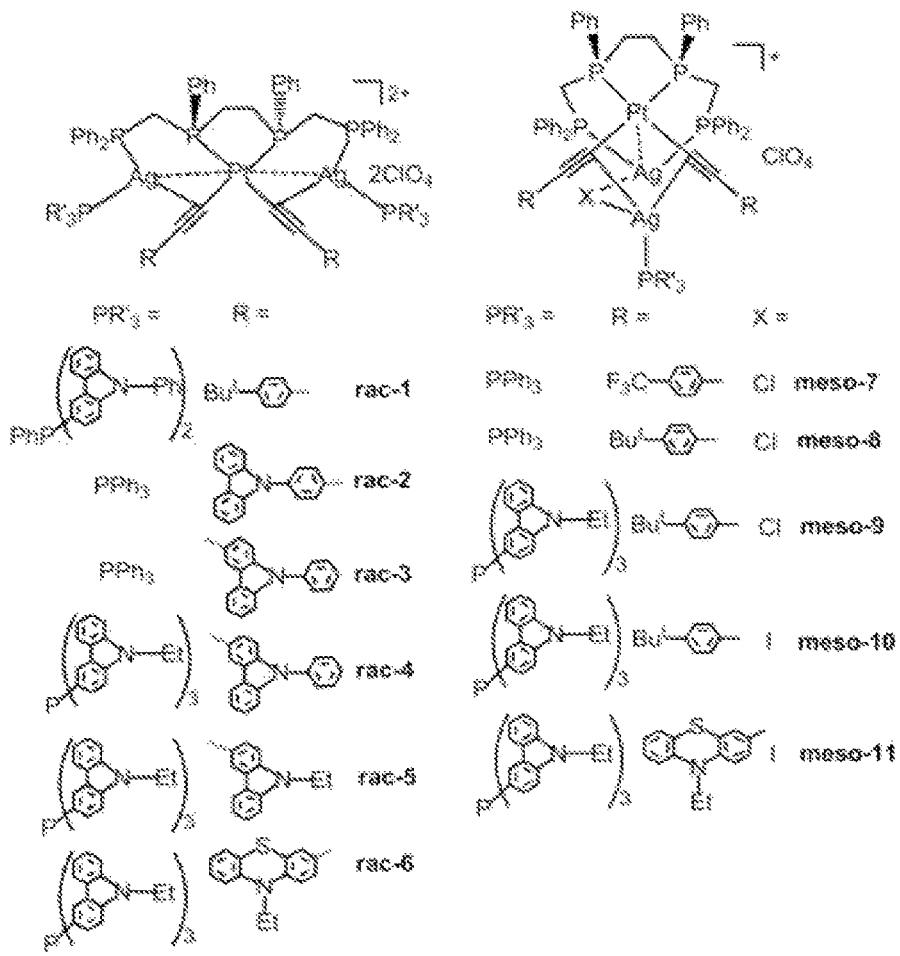
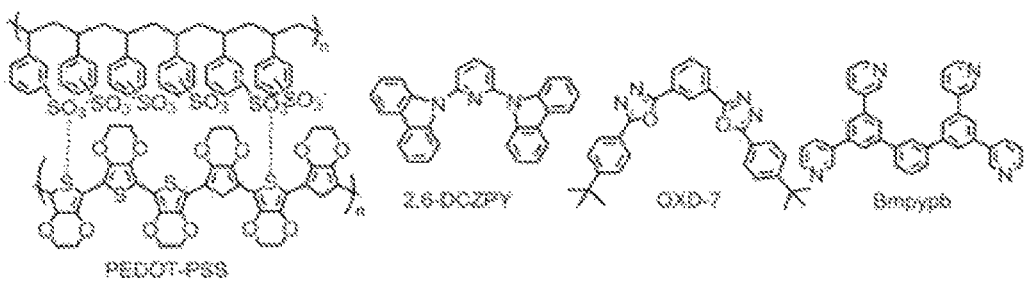

PHOSPHORESCENT PTAG2 COMPLEX, PREPARATION METHOD THEREFOR AND USE THEREOF

TECHNICAL FIELD

The present invention relates to the field of organic electroluminescence, which can be used in the field of full-color flat-panel displays and illumination. In particular, the present invention relates to a $PtAg_2$ (meso-/rac-dpmppe) heterotrinuclear metal-organic alkynyl complex for preparing organic light emitting diodes.

BACKGROUND ART

Organic electroluminescence refers to the phenomenon in which electrical energy is directly converted into light energy using organic light emitting diodes (OLEDs) at a low DC voltage in the range of 3V to 12V, which is broadly applied in the field of flat panel displays and lighting. Compared to traditional illumination and display technologies, organic electroluminescence has many advantages such as full-color display, wide viewing angle, high resolution, fast response, low power consumption, low temperature resistance, and so on; and organic light emitting devices have excellent characteristics such as simple structure, ultra-light, ultra-thin, flexible, foldable, and so on.

The key feature of organic light emitting diodes relies on light-emitting thin-film materials. At present, most of the phosphorescent materials used in commercial organic electroluminescent devices are electroneutral cyclometalated iridium (III) complexes, which are doped into organic host materials to form light-emitting layers. Its greatest advantage is that it is easy to fabricate ideal thin-film light-emitting layers by vacuum thermal evaporation. However, equipment required for vacuum evaporation is costly and, in particular, processes for preparing organic doped light-emitting thin-film layers are complicated, which greatly limit industrial development and commercial applications of organic light emitting diodes in large-area full-color displays. To break through the above technical bottlenecks, it is a feasible alternative to select ionic-type phosphorescent organometallic compounds with high quantum efficiency as luminescent materials. Compared to electroneutral compounds, processes for the preparation of ionic-type phosphorescent metal complexes are simpler and cheaper, and the complexes are more stable, and soluble in organic solvents, which make it suitable for fabricating films using large-area solution-based spin-coating or inkjet printing, thus significantly reducing device preparation costs.

DETAILED DESCRIPTION OF THE INVENTION

An object of the present invention is to provide a meso- or rac-ionic-type phosphorescent $PtAg_2$ complex, a preparation method therefor and use thereof.

Another object of the present invention is to provide a luminescent material containing the above ionic-type phosphorescent metal complex, which is used for preparing a high-performance organic light emitting diode.

The objects of the present invention can be realized by the following method.

An ionic-type phosphorescent metal complex with a racemization structure, which is shown in the following formula (I) or formula (II):

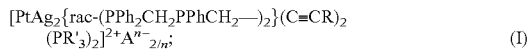

or

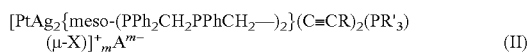

wherein,
R is identical or different, independently selected from alkyl, aryl, heteroaryl or heteroaryl aryl;
R' is identical or different, independently selected from alkyl, aryl or heteroaryl;
the alkyl group, aryl group, or heteroaryl group is optionally substituted by one or more substituents, and the substituent is selected from an alkyl group, an alkenyl group, an alkynyl group, an alkoxy group, an amino group, a halogen, a haloalkyl group and an aryl group;
X is halogen;
$A^{m-}$ or $A^{n-}$ is a monovalent or bivalent anion, and m or n is 1 or 2. The anion is, for example, $ClO_4^-$, $PF_6^-$, $SbF_6^-$, $BF_4^-$, $SiF_6^{2-}$, etc. μ stands for bridging.

According to the present invention, the complex of formula (I) has a racemic structure and the complex of formula (II) has a meso structure.

According to the present invention, the stereostructure of the phosphorescent metal complex of formula (I) or formula (II) is represented as follows:

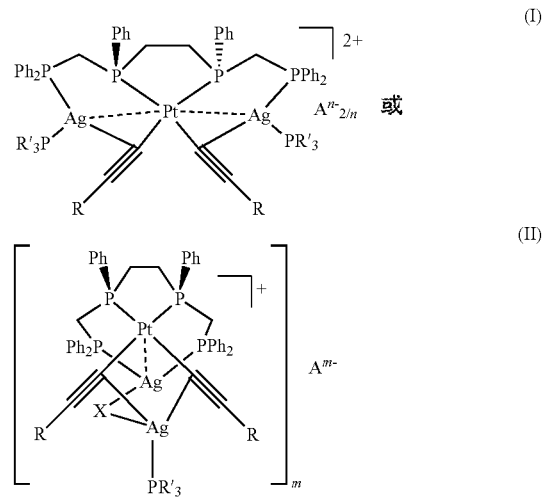

In the present invention, the alkyl group is a linear or branched alkyl group having 1 to 10 carbon atoms, preferably 1 to 6, for example, methyl, ethyl, propyl, n-butyl, isobutyl, t-butyl, etc.

The alkenyl group represents a linear or branched alkenyl group having 2 to 6 carbon atoms, for example, vinyl, propenyl, butenyl, etc.

The alkynyl group represents a linear or branched alkynyl group having 2 to 6 carbon atoms, for example, ethynyl, propynyl, butynyl, etc.

The aryl group is a monocyclic or polycyclic aromatic group having 6 to 20 carbon atoms. Representative aryl groups include phenyl, naphthyl, etc.

The heteroaryl group is a monocyclic or polycyclic heteroaromatic group having 1 to 20 carbon atoms containing at least one, preferably one to four, of heteroatoms selected from N, S or O. Representative heteroaromatic groups include pyrrolyl, pyridyl, pyrimidinyl, imidazolyl, thiazolyl, oxazolyl, oxadiazolyl, carbazolyl, quinolyl, quinozolinyl, indolyl, phenothiazinyl, etc.

According to the present invention, $A^{m-}$ or $A^{n-}$ is preferably $ClO_4^-$, $PF_6^-$, $SiF_6^{2-}$, etc., and m or n is 1 or 2.

According to the present invention, R is preferably aryl, carbazolyl, phenothiazinyl, or carbazolylaryl. The aryl group, carbazolyl group, or phenothiazinyl group is optionally substituted by one or more substituents, and the substituent is selected from the group consisting of alkyl, alkoxy, amino, halogen, haloalkyl, aryl; R' is preferably aryl, or nitrogen-containing heterocyclic group (e.g. carbazolyl); the aryl group, or nitrogen-containing heterocyclic group is optionally substituted by one or more substituents, and the substituent is selected from the group consisting of alkyl, alkoxy, amino, halogen, haloalkyl, aryl. More preferably, R is phenyl, alkylphenyl, haloalkylphenyl, carbazolylphenyl, carbazolyl, alkylcarbazolyl, phenylcarbazolyl, phenothiazinyl, or alkylphenothiazinyl; R' is phenyl, alkylphenyl, carbazolyl, alkylcarbazolyl, or phenylcarbazolyl.

According to the present invention, the specific structures of the ionic-type phosphorescent metal complexes are preferably represented as follows:

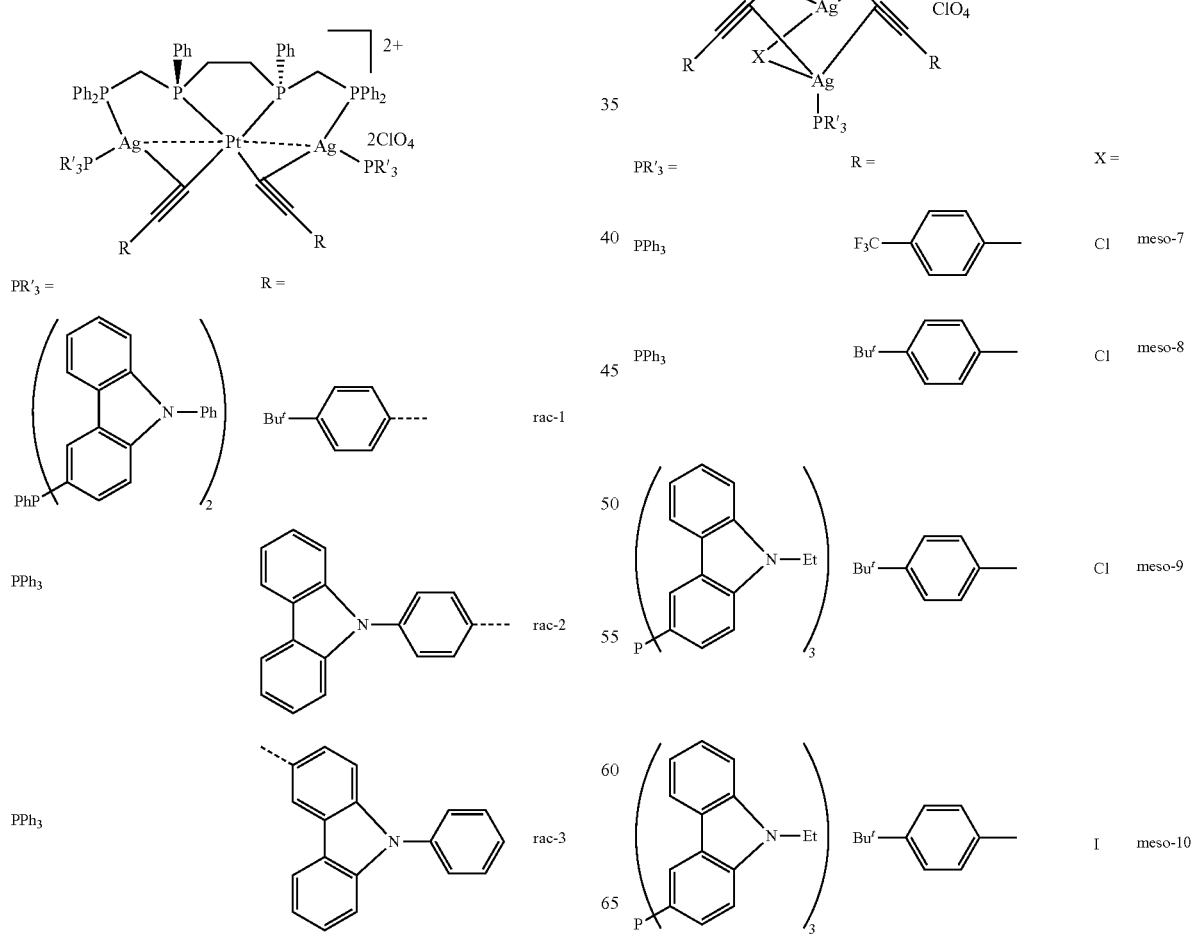

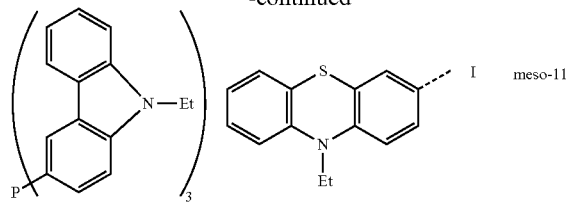

A method for preparing the phosphorescent complex of formula (I) is also provided by the present invention, comprising the following steps: 1) reacting rac-(PPh₂CH₂PPhCH₂—)₂ with Pt(PPh₃)₂(C≡CR)₂ in a solvent to obtain an intermediate; 2) the intermediate obtained in step 1) reacting with [Ag(tht)](A″⁻) and PR′₃ in a solvent to obtain the phosphorescent complex of formula (I), wherein tht is tetrahydrothiophene, and A″⁻, R, R' and X are as defined above.

A method for preparing the phosphorescent complex of formula (II) is also provided in the present invention, comprising the following steps: A) reacting meso-(PPh₂CH₂PPhCH₂—)₂ with Pt(PPh₃)₂(C≡CR)₂ in a solvent to obtain an intermediate; B) the intermediate obtained in step A) reacting with PR'₃, ″Bu₄NX and [Ag(tht)](A‴⁻) in a solvent to obtain the phosphorescent complex of formula (II), wherein tht is tetrahydrothiophene, and A‴⁻, R, R' and X are as defined above.

According to the present invention, in step 1) and step A), the solvent is preferably halogenated hydrocarbon, such as dichloromethane. Preferably, the intermediates obtained in the reaction are concentrated and recrystallized.

According to the present invention, in step 2) and step B), the solvent is preferably halogenated hydrocarbon, such as dichloromethane. Preferably, in step B), PR'₃ and ″Bu₄NX are firstly mixed to obtain a mixed solution, and then the mixed solution and [Ag(tht)](A‴⁻) are added to a solution in which the intermediate obtained in the above step A) is dissolved.

According to the present invention, in the method, a molar ratio of rac-(PPh₂CH₂PPhCH₂—)₂:Pt(PPh₃)₂(C≡CR)₂:[Ag(tht)](A″⁻):PR'₃ is 1-1.5:1-1.5:2-3:2-3, preferably 1:1:2:2; a molar ratio of meso-(PPh₂CH₂PPhCH₂—)₂:Pt(PPh₃)₂(C≡CR)₂:[Ag(tht)](A‴⁻):″Bu₄NX:PR'₃ is 1-1.5:1-1.5:2-3:1-1.5:1-1.5, preferably 1:1:2:1:1.

According to the present invention, the reactions are all carried out at room temperature. Preferably, after completion of the reaction, silica gel column chromatography is used for separation and purification.

The phosphorescent complex of formula (I) or formula (II) of the present invention exhibits relatively strong phosphorescence emission in solid and thin films, and the phosphorescence quantum yield of the thin films is greater than 50%; moreover, the emission spectrum is relatively broad from sky-blue to orange red. Therefore, it can be used as a dopant in a light-emitting layer, which is applied for preparing organic light emitting diodes.

Use of the phosphorescent complexes in organic light emitting diodes is also provided in the invention.

Furthermore, an organic light emitting diode, comprising a light-emitting layer, wherein the light-emitting layer comprises the phosphorescent complex of formula (I) or formula (II), is also provided in the present invention.

According to the present invention, in the light-emitting layer, the phosphorescent complex of formula (I) of the present invention preferably accounts for 3-20% (percentage by weight) of all materials, more preferably 5-10%. More preferably, 6% by weight of the phosphorescent complex of formula (I) of the invention doped into host materials is used as the light-emitting layer. The phosphorescent complex of formula (II) of the present invention accounts for 5-25% (percentage by weight) of all materials, more preferably 8-15%. More preferably, 10% by weight of the phosphorescent complex of formula (II) of the present invention doped into host materials is used as the light-emitting layer.

According to the present invention, the structures of the organic light emitting diodes may be various known in the prior art, preferably comprising an anode layer, a hole injection layer, optionally a hole transport layer, a light-emitting layer, an electron transport layer, an electron injection layer and a cathode layer. The organic light emitting diodes further comprises a substrate (e.g. a glass substrate). The anode can be indium tin oxide, and the hole injection layer can be PEDOT:PSS (PEDOT:PSS=poly(3,4-ethyleneoxythiophene)-poly(styrene sulfonate)). The hole transport layer is CuSCN, CuI, or CuBr. The light-emitting layer contains the phosphorescent complex of the present invention and a substance having a hole-transport and/or electron-transport property. Herein, the substance having a hole-transport property is one or more selected from 2,6-DCZPPY (2,6-bis (3-(9H-carbazol-9-yl)phenyl)pyridine), mCP (1,3-bis(9-carbazolyl)benzene), CBP (4,4'-bis(9H-carbazol-9-yl)-1,1'-biphenyl), or TCTA (tris(4-(9H-carbazol-9-yl)phenyl)amine). The substance having a electron-transport property is OXD-7 (1,3-bis(5-(4-(tert-butyl)phenyl)-1,3,4-oxadiazol-2-yl)benzene); the electron transport layer is one or more selected from BmPyPB (3,3", 5,5"-tetra(pyridin-3-yl)-1,1':3',1"-terphenyl), TPBi (1,3,5-tris(1-phenyl-1H-benzo[d]imidazole-2-yl)phenyl), BCP (2,9-dimethyl-4,7-diphenyl-1,10-phenanthroline) or OXD-7; the electron injection layer is LiF, and the cathode layer is Al.

According to the present invention, a device structure containing the phosphorescent complex of formula (I) is preferably ITO/PEDOT:PSS (50 nm)/CuSCN (30 nm)/70.5% 2,6-DCZPPY:23.5% OXD-7:6 wt % of the complex of formula (I) of the present invention (50 nm)/BmPyPB (50 nm)/LiF (1 nm)/Al (100 nm), or ITO/PEDOT:PSS (50 nm)/70.5% mCP:23.5% OXD-7:6 wt % of the complex of formula (I) of the present invention (50 nm)/BmPyPB (50 nm)/LiF (1 nm)/Al (100 nm); a device structure containing the phosphorescent complex of formula (II) is ITO/PEDOT:PSS (50 nm)/CuSCN (30 nm)/90% 2,6-DCZPPY:10 wt % of the complex of formula (II) of the present invention (50 nm)/BmPyPB (50 nm)/LiF (1 nm)/Al (100 nm), or ITO/PEDOT:PSS (50 nm)/90% mCP:10 wt % of the complex of formula (II) of the present invention (50 nm)/BmPyPB (50 nm)/LiF (1 nm)/Al (100 nm). Herein, ITO is an indium tin oxide conductive film, PEDOT:PSS is poly(3,4-ethyleneoxythiophene)-poly(styrene sulfonate), 2,6-DCZPPY is 2,6-bis (3-(9H-carbazol-9-yl)phenyl)pyridine, mCP is 1,3-bis(9-carbazolyl)benzene, OXD-7 is 1,3-bis(5-(4-(tert-butyl)phenyl)-1,3,4-oxadiazol-2-yl)benzene and BmPyPB is 3,3", 5,5"-tetra(pyridin-3-yl)-1,1':3',1"-terphenyl.

A method for preparing the organic light emitting diodes is also provided, the method comprising: 1) fabricating a hole injection layer of the organic light emitting diodes on an anode through a solution process; 2) optionally fabricating a hole transport layer of the organic light emitting diodes through a solution process; 3) fabricating a light-emitting layer doped with the phosphorescent complexes of the present invention through a solution process; 4) fabricating an electron transport layer, an electron injection layer and a cathode layer in sequence through a vacuum thermal evaporation deposition process.

In a preferred embodiment, for the phosphorescent complex of formula (I), the method comprises: firstly, fabricating a hole injection layer by using aqueous PEDOT:PSS; secondly, fabricating a hole transport layer by using a solution of cuprous thiocyanate in diethyl sulfide; furthermore, fabricating a light-emitting layer by doping the blended host materials of hole-transport 2,6-DCZPPY and electron-transport OXD-7 with the phosphorescent complex of formula (I) of the present invention; and then fabricating a BmPyPB electron transport layer, a LiF electron injection layer and an Al cathode layer in sequence through a vacuum thermal evaporation deposition process. For the phosphorescent complex of formula (II), the method comprises: firstly, fabricating a hole injection layer by using aqueous PEDOT:PSS; secondly, fabricating a hole transport layer by using a solution of cuprous thiocyanate in diethyl sulfide; furthermore, fabricating a light-emitting layer by doping hole-transport 2,6-DCZPPY and the phosphorescent complex of formula (II) of the present invention; and then fabricating a BmPyPB electron transport layer, a LiF electron injection layer and an Al cathode layer in sequence through a vacuum thermal evaporation deposition process.

According to the present invention, in the method, the PEDOT:PSS hole injection layer and the light-emitting layer doped with 2,6-DCZPPY:OXD-7 or 2,6-DCZPPY are, respectively, fabricated using a solution-based spin-coating method, and the BmPyPB electron transport layer and LiF electron injection layer are fabricated through a vacuum thermal evaporation deposition process.

The organic light emitting diodes prepared from the phosphorescent complexes of the present invention have excellent performance, and relatively high electrical-optical conversion efficiency.

Use of the organic light emitting diode is further provided, which can be used in the field of flat-panel displays and daily illumination.

Compared with the prior art, the present invention has the following advantages:
1) The phosphorescent complexes of the present invention exhibit strong phosphorescence emission in solid and thin films, wherein the quantum efficiency of the thin films is higher than 50% or even reaches 90%;
2) The organic light emitting devices are assembled by using the phosphorescent Pt—Ag heterometallic complexes as a luminescent material for the first time in the present invention, and the organic light emitting diodes prepared by using the phosphorescent complexes of the present invention as a dopant in the light-emitting layer exhibit high external quantum efficiency of electroluminescence;
3) The hole injection layer and the light-emitting layer of the organic light emitting diodes are fabricated through orthogonal solution process in the present invention, which can significantly reduce device preparation costs;
4) The ligands of the phosphorescent complexes of the present invention have meso/racemic configurations, the electroluminescent emission changes from sky blue to orange red, and the luminous efficiency of each color is relatively high.

DESCRIPTION OF THE DRAWING

FIG. 1 shows the schematic representation of the devices and the chemical structures of organic materials.

EXAMPLES

Hereinafter, the present invention will be further illustrated in more detail below with reference to the accompanying drawings and the examples to make the objects, technical solutions and technical effects clearer. It is to be understood that the examples described in the description are only illustrative of the present invention and are not intended to limit the present invention.

In the following examples, dpmppe stands for $(PPh_2CH_2PPhCH_2—)_2$, carb stands for carbazolyl, $PhBu^t$-4 stands for 4-tert-butyl-phenyl, 9-Ph-carb-3 stands for 9-phenyl-carbazol-3-yl, 9-Et-carb-3 stands for 9-ethyl-carbazol-3-yl, $PhCF_3$-4 stands for 4-trifluoromethyl-phenyl, 9-(4-Ph)-carb stands for 9-(4-phenyl)-carbazolyl, 10-Et-PTZ-3 stands for 10-ethyl-phenothiazin-3-yl, and tht is tetrahydrothiophene.

Example 1: Preparation of $[PtAg_2(rac\text{-}dpmppe)(C\equiv CC_6H_4Bu^t\text{-}4)_2\{PhP(9\text{-}Ph\text{-}carb\text{-}3)_2\}_2](ClO_4)_2$ (rac-1) Complex To a dichloromethane solution (20 mL) of $Pt(PPh_3)_2(C\equiv CC_6H_4Bu^t\text{-}4)_2$ (80.6 mg, 0.078 mmol) was added rac-dpmppe (50 mg, 0.078 mmol). After being stirred for 30 minutes, concentrated and added with 20 mL of hexane, a pale yellow solid was precipitated as an intermediate with a yield of 90% (80.8 mg). To a dichloromethane solution (20 mL) of the above intermediate were added $Ag(tht)ClO_4$ (41.4 mg, 0.14 mmol) and $PhP(9\text{-}Ph\text{-}carb\text{-}3)_2$ (82.9 mg, 0.14 mmol). After being stirred for 1 hour at room temperature, the reaction solution turned pale green. The product was purified by silica gel column chromatography using $CH_2Cl_2$:MeCN (8:1) as eluent, and the pale green product was collected. Yield: 70%. Elemental analysis $(C_{148}H_{122}Ag_2Cl_2N_4O_8P_6Pt)$, calculated: C, 64.59; H, 4.47; N, 2.04. Found: C, 64.40; H, 4.55; N, 1.96. ESI-MS m/z (%): 1276.2909 (100) $[M\text{-}2ClO_4]^{2+}$. $^1$H-NMR ($CDCl_3$, ppm): 8.20-8.14 (dd, 4H, $J_1$=16 Hz, $J_2$=12 Hz), 8.08-8.04 (dd, 4H, $J_1$=12 Hz, $J_2$=8 Hz), 7.73-7.59 (m, 12H), 7.53-7.35 (m, 36H), 7.27-7.11 (m, 20H), 6.95-6.88 (m, 12H), 6.69-6.67 (d, 4H, J=8 Hz), 6.59-6.57 (d, 4H, J=8 Hz), 4.29 (m, 2H), 3.02-2.93 (3, 2H), 2.63-2.46 (m, 2H), 0.97 (s, 18H), 0.54 (m, 2H). $^{31}$P-NMR ($CDCl_3$, ppm): 46.0 (d, 2P, $J_{P-P}$=78 Hz, $J_{Pt-P}$=2448 Hz), 13.8 (m, 2P, $J_{P-Ag}$=526 Hz), 1.8 (m, 2P, $J_{P-Ag}$=526 Hz, $J_{P-P}$=52 Hz). IR (KBr, $cm^{-1}$): 2081w ($C\equiv C$), 1099s ($ClO_4^-$).

Example 2: Preparation of $[PtAg_2(rac\text{-}dpmppe)\{(C\equiv C\text{-}4)C_6H_4\text{-}carb\text{-}9\}_2(PPh_3)_2](ClO_4)_2$ (rac-2) Complex The preparation method was basically the same as that in Example 1, except that $Pt(PPh_3)_2(C\equiv CC_6H_4Bu^t\text{-}4)_2$ was replaced by $Pt(PPh_3)_2\{(C\equiv C\text{-}4)C_6H_4\text{-}carb\text{-}9\}_2$, and $PhP(9\text{-}Ph\text{-}carb\text{-}3)_2$ was replaced by $PPh_3$. Yield: 71%. Elemental analysis $(C_{116}H_{92}Ag_2Cl_2N_2O_8P_6Pt)$, calculated: C, 60.33; H, 4.02; N, 1.21. Found: C, 60.12; H, 4.02; N, 1.15. ESI-MS m/z (%): 1055.1713 (100%, $[M\text{-}2ClO_4]^{2+}$). $^1$H-NMR ($CDCl_3$, ppm): 8.21-8.13 (m, 8H), 7.59-7.54 (m, 14H), 7.48-7.14 (m, 18H), 7.34-7.24 (m, 22H), 7.20-7.12 (m, 14H), 7.02-6.98 (m, 4H), 6.86-6.85 (d, 4H, J=7 Hz), 4.59 (m, 2H), 3.15-3.06 (m, 2H), 2.73-2.59 (m, 2H), 0.61 (m, 2H). $^{31}$P-NMR ($CDCl_3$, ppm): 47.0 (d, 2P, $J_{P-P}$=76 Hz, $J_{Pt-P}$=2375 Hz), 11.8 (m, 2P, $J_{P-Ag}$=506 Hz), 3.4 (m, 2P, $J_{P-Ag}$=410 Hz, $J_{P-P}$=45 Hz). IR (KBr, $cm^{-1}$): 2091w ($C\equiv C$), 1099s ($ClO_4^-$).

Example 3: Preparation of $[PtAg_2(rac\text{-}dpmppe)\{C\equiv C\text{-}(9\text{-}Ph\text{-}carb\text{-}3)\}_2(PPh_3)_2](ClO_4)_2$ (rac-3) Complex The preparation method was basically the same as that in Example 1, except that $Pt(PPh_3)_2(C\equiv CC_6H_4Bu^t\text{-}4)_2$ was replaced by Pt(PPh$_3$)$_2$(C≡C-(9-Ph-carb-3))$_2$, and PhP(9-Ph-carb-3)$_2$ was replaced by PPh$_3$. Yield: 71%. Elemental analysis (C$_{116}$H$_{92}$Ag$_2$Cl$_2$N$_2$O$_8$P$_6$Pt), calculated: C, 60.33; H, 4.02; N, 1.21. Found: C, 60.10; H, 4.05; N, 1.16. ESI-MS m/z (%): 1055.1717 (100%, [M-2ClO$_4$]$^{2+}$). $^1$H-NMR (CDCl$_3$, ppm): 8.17-8.12 (dd, 4H, J$_1$=12 Hz, J$_2$=8 Hz), 7.67-7.63 (t, 4H, J=8 Hz), 7.54-7.46 (m, 22H), 7.43-7.40 (m, 8H), 7.37-7.31 (m, 10H), 7.29-7.18 (m, 10H), 7.13-7.03 (m, 20H), 6.95-6.92 (m, 4H), 6.83-6.81 (d, 2H), 4.45 (m, 2H), 3.18-3.09 (m, 2H), 2.69-2.50 (m, 2H), 0.59 (m, 2H). $^{31}$P-NMR (CDCl$_3$, ppm): 46.3 (d, 2P, J$_{P-P}$=75 Hz, J$_{Pt-P}$=2384 Hz), 11.9 (m, 2P, J$_{P-Ag}$=510 Hz), 2.4 (m, 2P, J$_{P-Ag}$=398 Hz, J$_{P-P}$=51 Hz). IR (KBr, cm$^{-1}$): 2075w (C≡C), 1093s (ClO$_4^-$).

Example 4: Preparation of [PtAg$_2$(rac-dpmppe)(C≡C-(9-Ph-carb-3))$_2${P(9-Et-carb-3)$_3$}$_2$](ClO$_4$)$_2$ (rac-4) Complex The preparation method was basically the same as that in Example 1, except that Pt(PPh$_3$)$_2$(C≡CC$_6$H$_4$Bu$^t$-4)$_2$ was replaced by Pt(PPh$_3$)$_2${C≡C-(9-Ph-carb-3)}$_2$, and PhP(9-Ph-carb-3)$_2$ was replaced by P(9-Et-carb-3)$_3$. Yield: 71%. Elemental analysis (C$_{164}$H$_{134}$Ag$_2$Cl$_2$N$_8$O$_8$P$_6$Pt), calculated: C, 65.39; H, 4.48; N, 3.72. Found: C, 65.14; H, 4.53; N, 3.53. ESI-MS m/z (%): 1406.8446 [M-2ClO$_4$]$^{2+}$. $^1$H-NMR (CDCl$_3$, ppm): 8.27-8.22 (dd, 4H, J$_1$=12 Hz, J$_2$=8 Hz), 8.20-8.17 (d, 6H, J=12 Hz), 8.04-7.99 (dd, 6H, J$_1$=12 Hz, J$_2$=8 Hz), 7.71 (s, 2H), 7.50-7.40 (m, 16H), 7.37-7.32 (m, 12H), 7.27-7.25 (m, 10H), 7.17-7.14 (m, 6H), 7.07-7.03 (t, 2H, J=7 Hz), 7.0-6.90 (m, 12H), 6.88-6.77 (m, 16H), 6.73-6.66 (m, 4H), 4.4 (m, 2H), 3.88-3.83 (q, 12H, J=7 Hz), 3.27-3.18 (m, 2H), 2.62-2.44 (m, 2H), 1.0-0.97 (d, 18H, J=7 Hz), 0.72 (m, 2H). $^{31}$P-NMR (CDCl$_3$, ppm): 46.5 (d, 2P, J$_{P-P}$=78 Hz, J$_{Pt-P}$=2380 Hz), 15.3 (m, 2P, J$_{P-Ag}$=534 Hz), 0.8 (m, 2P, J$_{P-Ag}$=378 Hz, J$_{P-P}$=53 Hz). IR (KBr, cm$^{-1}$): 2081w (C≡C), 1093s (ClO$_4^-$).

Example 5: Preparation of [PtAg$_2$(rac-dpmppe){C≡C-(9-Et-carb-3)}$_2${P(9-Et-carb-3)$_3$}$_2$] (ClO$_4$)$_2$ (rac-5) Complex The preparation method was basically the same as that in Example 1, except that Pt(PPh$_3$)$_2$(C≡CC$_6$H$_4$Bu$^t$-4)$_2$ was replaced by Pt(PPh$_3$)$_2${C≡C-(9-Et-carb-3)}$_2$, and PhP(9-Ph-carb-3)$_2$ was replaced by P(9-Et-carb-3)$_3$. Yield: 72%. Elemental analysis (C$_{156}$H$_{134}$Ag$_2$Cl$_2$N$_8$O$_8$P$_6$Pt), calculated: C, 64.25; H, 4.63; N, 3.84. Found: C, 64.02; H, 4.65; N, 3.58. ESI-MS m/z (%): 1358.3459 (100%) [M-2ClO$_4$]$^{2+}$. $^1$H-NMR (CDCl$_3$, ppm): 8.25-8.16 (m, 8H), 8.01 (m, 6H), 7.73-7.68 (m, 10H), 7.44-7.27 (m, 28H), 7.18-7.02 (m, 10H), 6.94-6.82 (m, 22H), 6.70-6.64 (m, 4H), 4.33 (m, 2H), 4.05-3.99 (q, 4H, J=7 Hz), 3.85-3.79 (q, 12H, J=7 Hz), 3.26-3.22 (m, 2H), 2.64-2.51 (m, 2H), 1.29-1.15 (t, 6H, J=7 Hz), 1.11-0.97 (t, 18H, J=7 Hz), 0.71 (m, 2H). $^{31}$P-NMR (CDCl$_3$, ppm): 46.2 (d, 2P, J$_{P-P}$=78 Hz, J$_{Pt-P}$=2376 Hz), 15.3 (m, 2P, J$_{P-Ag}$=524 Hz), 0.6 (m, 2P, J$_{P-Ag}$=369 Hz, J$_{P-P}$=52 Hz). IR (KBr, cm$^{-1}$): 2073w (C≡C), 1093s (ClO$_4^-$).

Example 6: Preparation of [PtAg$_2$(rac-dpmppe){C≡C-(10-Et-PTZ-3)}$_2${P(9-Et-carb-3)$_3$}$_2$] (ClO$_4$)$_2$ (rac-6) Complex The preparation method was basically the same as that in Example 1, except that Pt(PPh$_3$)$_2$(C≡CC$_6$H$_4$Bu$^t$-4)$_2$ was replaced by Pt(PPh$_3$)$_2${C≡C-(10-Et-PTZ-3)}$_2$, and PhP(9-Ph-carb-3)$_2$ was replaced by P(9-Et-carb-3)$_3$. Yield: 73%. Elemental analysis (C$_{156}$H$_{134}$Ag$_2$Cl$_2$N$_8$O$_8$P$_6$PtS$_2$), calculated: C, 62.86; H, 4.53; N, 3.76. Found: C, 62.62; H, 4.57; N, 3.59. ESI-MS m/z (%): 1390.8150 (100%) [M-2ClO$_4$]$^{2+}$. $^1$H-NMR (CDCl$_3$, ppm): 8.16-8.13 (m, 8H), 8.01-7.96 (dd, 6H, J=8 Hz), 7.58-7.55 (m, 6H), 7.42-7.38 (m, 12H), 7.34-7.30 (m, 8H), 7.15-6.99 (m, 22H), 6.90-6.86 (m, 14H), 6.69-6.67 (d, 2H, J=8 Hz), 6.54-6.52 (d, 2H, J=8 Hz), 6.35-6.32 (m, 4H), 5.92-5.90 (d, 2H, J=8 Hz), 4.23 (m, 2H), 4.05-3.99 (q, 12H, J=7 Hz), 3.45-3.39 (q, 4H, J=7 Hz), 3.06-2.97 (m, 2H), 2.64-2.45 (m, 2H), 1.18-1.14 (t, 18H, J=7 Hz), 1.06-1.02 (t, 6H, J=7 Hz), 0.59 (m, 2H). $^{31}$P-NMR (CDCl$_3$, ppm): 46.5 (d, 2P, J$_{P-P}$=78 Hz, J$_{Pt-P}$=2376 Hz), 15.2 (m, 2P, J$_{P-Ag}$=536 Hz), 1.5 (m, 2P, J$_{P-Ag}$=381 Hz, J$_{P-P}$=54 Hz). IR (KBr, cm$^{-1}$): 2081w (C≡C), 1093s (ClO$_4^-$).

Example 7: Preparation of [PtAg$_2$(meso-dpmppe)(C≡CC$_6$H$_4$CF$_3$-4)$_2$(PPh$_3$)Cl](ClO$_4$) (meso-7) Complex To a dichloromethane solution (20 mL) of Pt(PPh$_3$)$_2$(C≡CC$_6$H$_4$CF$_3$-4)$_2$ (82.5 mg, 0.078 mmol) was added meso-dpmppe (50 mg, 0.078 mmol). After being stirred for 30 minutes, concentrated and added with 20 mL of hexane, a pale yellow solid was precipitated as an intermediate with a yield of 90% (82.4 mg). PPh$_3$ (18.3 mg, 0.07 mmol) and $^n$Bu$_4$NCl (19.5 mg, 0.07 mmol) were firstly mixed. To a dichloromethane solution (20 mL) of the above intermediate were added the mixed solution and Ag(tht)ClO$_4$ (41.4 mg, 0.14 mmol). After being stirred for 1 hour at room temperature, the reaction solution turned pale blue. The product was purified by silica gel column chromatography using CH$_2$Cl$_2$:MeCN (15:1) as eluent, and the pale yellow product was collected. Yield: 75%. Elemental analysis (C$_{76}$H$_{61}$Ag$_2$Cl$_2$F$_6$O$_4$P$_5$Pt), calculated: C, 51.03; H, 3.44. Found: C, 51.21; H, 3.60. ESI-MS m/z (%): 1688.0808 (100%, [M-ClO$_4$]$^+$). $^1$H-NMR (CDCl$_3$, ppm): 8.03-7.96 (m, 8H), 7.59-7.36 (m, 22H), 7.33-7.29 (t, 4H, J=7 Hz), 7.25-7.17 (m, 11H), 6.92-6.89 (m, 4H), 6.65-6.62 (m, 4H), 3.86 (m, 2H), 3.37 (m, 2H), 2.28-2.11 (m, 4H). $^{31}$P-NMR (CDCl$_3$, ppm): 47.6 (dd, 2P, J$_{P-P}$=30 Hz, J$_{Pt-P}$=2412 Hz), 7.6 (m, 1P, J$_{P-Ag}$=579 Hz), −8.9 (m, 2P, J$_{P-Ag}$=422 Hz, J$_{P-P}$=59 Hz). IR (KBr, cm$^{-1}$): 2092w (C≡C), 1104s (ClO$_4^-$).

Example 8: Preparation of [PtAg$_2$(meso-dpmppe)(C≡CC$_6$H$_4$Bu$^t$-4)$_2$(PPh$_3$)Cl](ClO$_4$) (meso-8) Complex The preparation method was basically the same as that in Example 7, except that Pt(PPh$_3$)$_2$(C≡CC$_6$H$_4$CF$_3$-4)$_2$ was replaced by Pt(PPh$_3$)$_2$(C≡CC$_6$H$_4$Bu$^t$-4)$_2$. Yield: 74%. Elemental analysis (C$_{82}$H$_{79}$Ag$_2$Cl$_2$O$_4$P$_5$Pt), calculated: C, 55.80; H, 4.51. Found: C, 56.02; H, 4.74. ESI-MS m/z (%): 1665.2304 (100%, [M-ClO$_4$]$^+$). $^1$H-NMR (CDCl$_3$, ppm): 8.03-7.97 (m, 8H), 7.53-7.50 (m, 7H), 7.41-7.31 (m, 20H), 7.24-7.16 (m, 12H), 6.71-6.59 (m, 8H), 3.81 (m, 2H), 3.46 (m, 2H), 2.18-2.01 (m, 4H), 1.45 (s, 18H). $^{31}$P-NMR (CDCl$_3$, ppm): 47.1 (q, 2P, J$_{P-P}$=30 Hz, J$_{Pt-P}$=2409 Hz), 7.2 (m, 1P, J$_{P-Ag}$=565 Hz), −9.5 (m, 2P, J$_{P-Ag}$=417 Hz, J$_{P-P}$=58 Hz). IR (KBr, cm$^{-1}$): 2092w (C≡C), 1093s (ClO$_4^-$).

Example 9: Preparation of [PtAg$_2$(meso-dpmppe)(C≡CC$_6$H$_4$Bu$^t$-4)$_2${P(9-Et-carb-3)$_3$}Cl] (ClO$_4$) (meso-9) Complex The preparation method was basically the same as that in Example 7, except that Pt(PPh$_3$)$_2$(C≡CC$_6$H$_4$CF$_3$-4)$_2$ was replaced by Pt(PPh$_3$)$_2$(C≡CC$_6$H$_4$Bu$^t$-4)$_2$, and PPh$_3$ was replaced by P(9-Et-carb-3)$_3$. Yield: 74%. Elemental analysis (C$_{106}$H$_{100}$Ag$_2$Cl$_2$N$_3$O$_4$P$_5$Pt), calculated: C, 60.15; H, 4.76; N, 1.99. Found: C, 60.32; H, 4.73; N, 1.88. ESI-MS m/z (%): 2016.4011 (100%, [M-ClO$_4$]$^+$). $^1$H-NMR (CDCl$_3$, ppm): 8.48-8.45 (d, 2H, J=12 Hz), 8.08-8.04 (dd, 4H, J$_1$=12 Hz, J$_2$=8 Hz), 7.94-7.92 (d, 2H, J=8 Hz), 7.89 (m, 4H), 7.53-7.41 (m, 26H), 7.25-7.15 (m, 13H), 6.61-6.59 (m, 4H), 6.40-6.38 (m, 4H), 4.41-4.37 (q, 6H, J=7 Hz), 3.76 (m, 2H), 3.49 (m, 2H), 2.24-2.05 (m, 4H), 1.49-1.47 (t, 9H, J=7 Hz), 0.76 (s, 18H). $^{31}$P-NMR (CDCl$_3$, ppm): 47.5 (q, 2P, J$_{P—P}$=29 Hz, J$_{Pt—P}$=2394 Hz), 10.4 (m, 1P, J$_{P—Ag}$=601 Hz), -9.3 (m, 2P, J$_{P—Ag}$=417 Hz, J$_{P—P}$=56 Hz). IR (KBr, cm$^{-1}$): 2110w (C≡C), 1093s (ClO$_4^-$).

Example 10: Preparation of [PtAg$_2$(meso-dpmppe) (C≡CC$_6$H$_4$Bu$^t$-4)$_2${P(9-Et-carb-3)$_3$}I] (ClO$_4$) (meso-10) Complex The preparation method was basically the same as that in Example 7, except that Pt(PPh$_3$)$_2$(C≡CC$_6$H$_4$CF$_3$-4)$_2$ was replaced by Pt(PPh$_3$)$_2$(C≡CC$_6$H$_4$Bu$^t$-4)$_2$, PPh$_3$ was replaced by P(9-Et-carb-3)$_3$, and $^n$Bu$_4$NCl was replaced by $^n$Bu$_4$NI. Yield: 72%. Elemental analysis (C$_{106}$H$_{100}$Ag$_2$ClIN$_3$O$_4$P$_5$Pt), calculated: C, 57.66; H, 4.56; N, 1.90. Found: C, 57.57; H, 4.60; N, 1.83. ESI-MS m/z (%): 2108.3387 (100%, [M-ClO$_4$]$^+$). $^1$H-NMR (CDCl$_3$, ppm): 8.51-8.48 (d, 2H, J=12 Hz), 8.11-8.07 (dd, 4H, J$_1$=12 Hz, J$_2$=8 Hz), 7.98-7.96 (d, 2H, J=8 Hz), 7.82 (m, 4H), 7.54-7.40 (m, 26H), 7.29-7.16 (m, 13H), 6.54-6.52 (m, 4H), 6.37-6.35 (m, 4H), 4.39-4.35 (q, 6H, J=7 Hz), 3.71 (m, 2H), 3.52 (m, 2H), 2.25-2.05 (m, 4H), 1.49-1.47 (t, 9H, J=7 Hz), 0.72 (s, 18H). $^{31}$P-NMR (CDCl$_3$, ppm): 48.5 (q, 2P, J$_{P—P}$=30 Hz, J$_{Pt—P}$=2391 Hz), 9.0 (m, 1P, J$_{P—Ag}$=547 Hz), -11.7 (m, 2P, J$_{P—Ag}$=386 Hz, J$_{P—P}$=59 Hz). IR (KBr, cm$^{-1}$): 2104w (C≡C), 1093s (ClO$_4^-$).

Example 11: Preparation of [PtAg$_2$(meso-dpmppe) (C≡C-(10-Et-PTZ-3))$_2$ {P(9-Et-carb-3)$_3$}(μ-I)] (ClO$_4$) (meso-11) Complex The preparation method was basically the same as that in Example 7, except that Pt(PPh$_3$)$_2$(C≡CC$_6$H$_4$CF$_3$-4)$_2$ was replaced by Pt(PPh$_3$)$_2${C≡C-(10-Et-PTZ-3)}$_2$, PPh$_3$ was replaced by P(9-Et-carb-3)$_3$, and $^n$Bu$_4$NCl was replaced by $^n$Bu$_4$NI. Yield: 75%. Elemental analysis (C$_{114}$H$_{98}$Ag$_2$ClIN$_5$O$_4$P$_5$PtS$_2$), calculated: C, 57.19; H, 4.13; N, 2.93. Found: C, 57.42; H, 4.33; N, 2.84. ESI-MS m/z (%): 2294.2671 (100%, [M-ClO$_4$]$^+$). $^1$H-NMR (CDCl$_3$, ppm): 8.54-8.51 (d, 2H, J=12 Hz), 8.09-8.04 (dd, 4H, J$_1$=12 Hz, J$_2$=8 Hz), 7.95-7.93 (d, 2H, J=8 Hz), 7.80 (m, 4H), 7.59-7.29 (m, 29H), 7.18-7.01 (m, 12H), 6.75 (m, 4H), 6.51-6.49 (d, 2H, J=8 Hz), 6.41-6.39 (d, 2H, J=8 Hz), 6.22 (s, 2H), 5.63-5.61 (d, 2H, J=8 Hz), 4.45-4.27 (q, 6H, J=7 Hz), 3.71 (m, 2H), 3.46 (m, 2H), 3.14-3.08 (q, 4H, J=6 Hz), 2.28-2.03 (m, 4H), 1.44-1.40 (t, 9H, J=7 Hz), 0.86-0.81 (t, 6H, J=6 Hz). $^{31}$P-NMR (CDCl$_3$, ppm): 48.6 (q, 2P, J$_{P—P}$=29 Hz, J$_{Pt—P}$=2391 Hz), 9.1 (m, 1P, J$_{P—Ag}$=548 Hz), -11.4 (m, 2P, J$_{P—Ag}$=384 Hz, J$_{P—P}$=60 Hz). IR (KBr, cm$^{-1}$): 2101w (C≡C), 1094s (ClO$_4^-$).

Example 12: Photoluminescence Performance Measurement

The excitation spectra, emission spectra, luminescence lifetimes and luminescence quantum yields of the complex rac-1, rac-4, rac-5, rac-6 prepared in Examples 1, 4, 5 and 6 in solid powder and in the thin film of 70.5% 2,6-DCZPPY: 23.5% OXD-7:6% of the complex rac-1, rac-4, rac-5 and rac-6 of the present invention (by weight), and the complex meso-11 prepared in Example 11 in solid powder and in the thin film of 90% 2,6-DCZPPY:10% of the complex meso-11 of the present invention (by weight) were measured on Edinburgh FLS920 fluorescence spectrometer, respectively. The luminescence quantum yields of the solid powder samples were determined by using a 142-mm-diameter integrating sphere.

The emission wavelengths and quantum yields of the complexes rac-1, rac-4, rac-5, rac-6 and meso-11 in solid state were 500 nm and 15.1% (rac-1), 566 nm and 37.1% (rac-4), 580 nm and 30.4% (rac-5), 662 nm and 1.7% (rac-6) and 600 nm and 8.1% (meso-11), respectively;

The emission wavelengths and quantum yields of the complexes rac-1, rac-4, rac-5 and rac-6 in the thin film of 70.5% 2,6-DCZPPY:23.5% OXD-7:6% of the complexes rac-1, rac-4, rac-5 and rac-6 of the present invention (by weight) were 487 nm and 52.2% (rac-1), 527 nm and 90.5% (rac-4), 535 nm and 77.0% (rac-5), 616 nm and 56.8% (rac-6), respectively; the emission wavelength and quantum yield of the complex meso-11 in the thin film of 90% 2,6-DCZPPY: 10% of the complex meso-11 of the present invention (by weight) were 570 nm and 52.2% (meso-11).

Example 13: Fabrication of Organic Light Emitting Diodes and Electroluminescence Performance Measurement The organic light emitting diode was prepared with a light-emitting layer by doping the blended host materials of 2,6-DCZPPY (70.5%):OXD-7 (23.5%) with 6 wt % of the phosporescent complex rac-1, rac-4, rac-5, or rac-6 prepared in Example 1, 4, 5, or 6 as a luminescent material, respectively. The device structure was ITO/PEDOT:PSS (50 nm)/CuSCN (30 nm)/70.5% 2,6-DCZPPY:23.5% OXD-7:6 wt % of the complex rac-1, rac-4, rac-5, or rac-6 of the invention (50 nm)/BmPyPB (50 nm)/LiF (1 nm)/Al (100 nm); the organic light emitting diode was prepared with a light-emitting layer by doping the host materials of 2,6-DCZPPY (90%) with 10 wt % of the phosporescent complex meso-11 prepared in Example 11 as a luminescent material. The device structure was ITO/PEDOT:PSS (50 nm)/CuSCN (30 nm)/90% 2,6-DCZPPY:10 wt % of the complex meso-11 of the present invention (50 nm)/BmPyPB (50 nm)/LiF (1 nm)/Al (100 nm).

Firstly, an ITO substrate was cleaned with deionized water, acetone and isopropanol, respectively, followed by UV-ozone treatment for 15 minutes. The filtered aqueous solution of PEDOT:PSS was spin coated onto the ITO substrate at 4800 rpm, dried at 140° C. for 20 minutes to afford a 50-nm-thick hole injection layer. And then a solution of CuSCN in diethyl sulfide (10 mg/mL) was spin coated at 4800 rpm onto the PEDOT:PSS hole injection layer, dried at 120° C. for 30 minutes to afford a 30-nm-thick hole transport layer. Secondly, the filtered solution of 70.5% 2,6-DCZPPY:23.5% OXD-7:6% the complex rac-1, rac-4, rac-5, or rac-6 of the present invention (percentage by weight) in diethyl sulfide (5.5 mg/mL), or a solution of 90% 2,6-DCZPPY:10% the complex meso-11 of the present invention (percentage by weight) in diethyl sulfide (5.5 mg/mL) was spin coated at 2100 rpm onto the PEDOT:PSS thin film to form a 50-nm-thick light-emitting layer. After that, the ITO substrate was loaded into a vacuum deposition chamber with a pressure of less than 4×10$^{-4}$ Pa, and subsequently thermally deposited with a 50-nm-thick BmPyPB layer, a 1-nm-thick LiF electron injection layer, and 100-nm-thick Al as a cathode of the device.

The LED device performance was determined at room temperature in dry ambient air. The parameters of the electroluminescence performance, including electroluminescence emission wavelength ($\lambda_{EL}$), turn-on voltage ($V_{on}$), maximum luminance ($L_{max}$), maximum current efficiency ($CE_{max}$), maximum power efficiency ($PE_{max}$), and maximum external quantum efficiency ($EQE_{max}$), are listed in Table 1.

TABLE 1

Electroluminescence performance data of the phosphorescent complex rac-1, rac-4, rac-5, rac-6 or meso-11 of the invention

| Complex | $\lambda_{EL}$ [nm] | $V_{on}$ [V][a] | $L_{max}$ [cd/m²][b] | $CE_{max}$ [cd/A][c] | $PE_{max}$ [lm/W][d] | $EQE_{max}$ [%][e] | CIE[f] |
|---|---|---|---|---|---|---|---|
| rac-1 | 486 | 4.8 | 1703 | 27.20 | 13.25 | 11.1 | 0.19, 0.24 |
| rac-4 | 527 | 4.8 | 7764 | 60.96 | 30.89 | 18.1 | 0.24, 0.48 |
| rac-5 | 537 | 4.7 | 6652 | 57.00 | 28.70 | 16.6 | 0.28, 0.53 |
| rac-6 | 616 | 4.6 | 1898 | 19.84 | 9.89 | 12.4 | 0.53, 0.46 |
| meso-11 | 572 | 3.9 | 2336 | 30.65 | 18.68 | 10.4 | 0.41, 0.54 |

[a] turn-on voltage at luminance of 1 cd/m²,
[b] maximum luminance,
[c] maximum current efficiency,
[d] maximum power efficiency,
[e] maximum external quantum efficiency,
[f] chromaticity coordinates.

The invention claimed is:

1. An ionic-type phosphorescent metal complex having a structure as shown in the following formula (I) or formula (II):

[PtAg₂{rac-(PPh₂CH₂PPhCH₂—)₂}(C≡CR)₂(PR'₃)₂]²⁺A$^{n-}_{2/n}$;  (I)

or

[PtAg₂{meso-(PPh₂CH₂PPhCH₂—)₂}(C≡CR)₂(PR'₃)(μ-X)]⁺$_m$A$^{m-}$  (II), wherein:
R is identical or different, independently selected from alkyl, aryl, heteroaryl, and heteroaryl aryl;
R' is identical or different, independently selected from alkyl, aryl, and heteroaryl;
the alkyl, the aryl, or the heteroaryl is optionally substituted by one or more substituents selected from an alkyl group, an alkenyl group, an alkynyl group, an alkoxy group, an amino group, a halogen, a haloalkyl group, and an aryl group;
X is halogen;
A$^{m-}$ is a monovalent or bivalent anion, A$^{n-}$ is a monovalent or bivalent anion, m is 1 or 2, and n is 1 or 2; and
μ stands for bridging.

2. The ionic-type phosphorescent metal complex according to claim 1, wherein a stereostructure of the ionic-type phosphorescent metal complex of formula (I) or formula (II) is represented as follows:

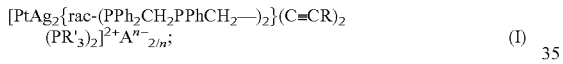

or

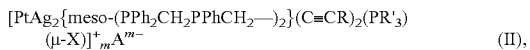

3. The ionic-type phosphorescent metal complex according to claim 1, wherein R is aryl, carbazolyl, phenothiazinyl or carbazolylaryl; the aryl, the carbazolyl or the phenothiazinyl is optionally substituted by one or more substituents selected from alkyl, alkoxy, amino, halogen, haloalkyl, and aryl; R' is aryl or a nitrogen-containing heterocyclic; the aryl or the nitrogen-containing heterocyclic is optionally substituted by one or more substituents selected from alkyl, alkoxy, amino, halogen, haloalkyl, and aryl.

4. The ionic-type phosphorescent metal complex according to claim 3, wherein R is phenyl, alkylphenyl, haloalkylphenyl, carbazolylphenyl, carbazolyl, alkylcarbazolyl, phenylcarbazolyl, phenothiazinyl, or alkylphenothiazinyl; and R' is phenyl, alkylphenyl, carbazolyl, alkylcarbazolyl, or phenylcarbazolyl.

5. The ionic-type phosphorescent metal complex according to claim 1 selected from eleven complexes illustrated in the following:

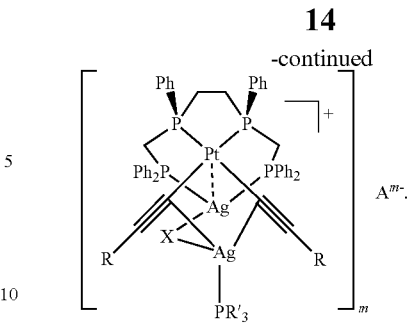

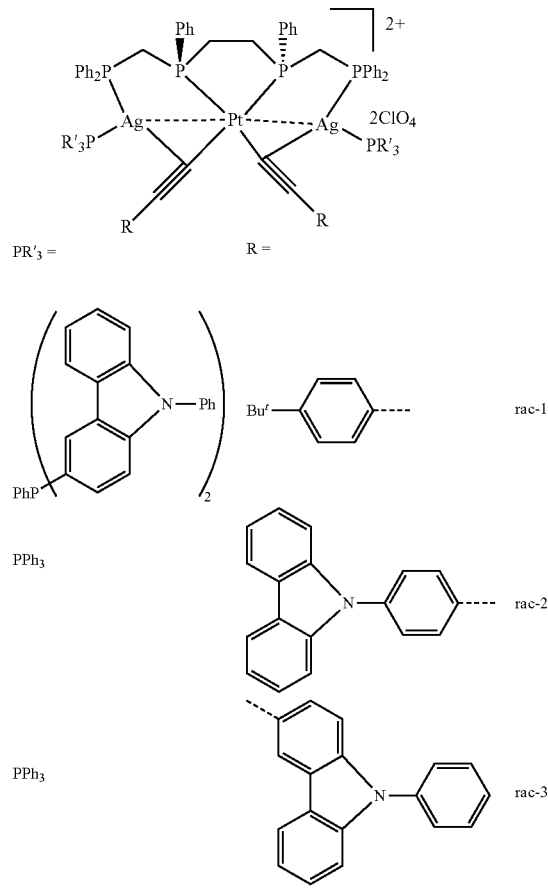

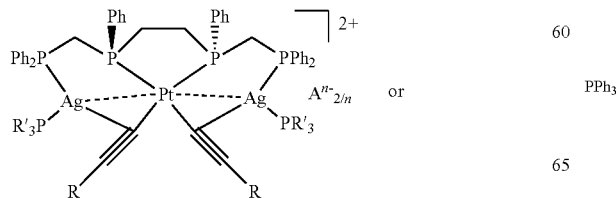

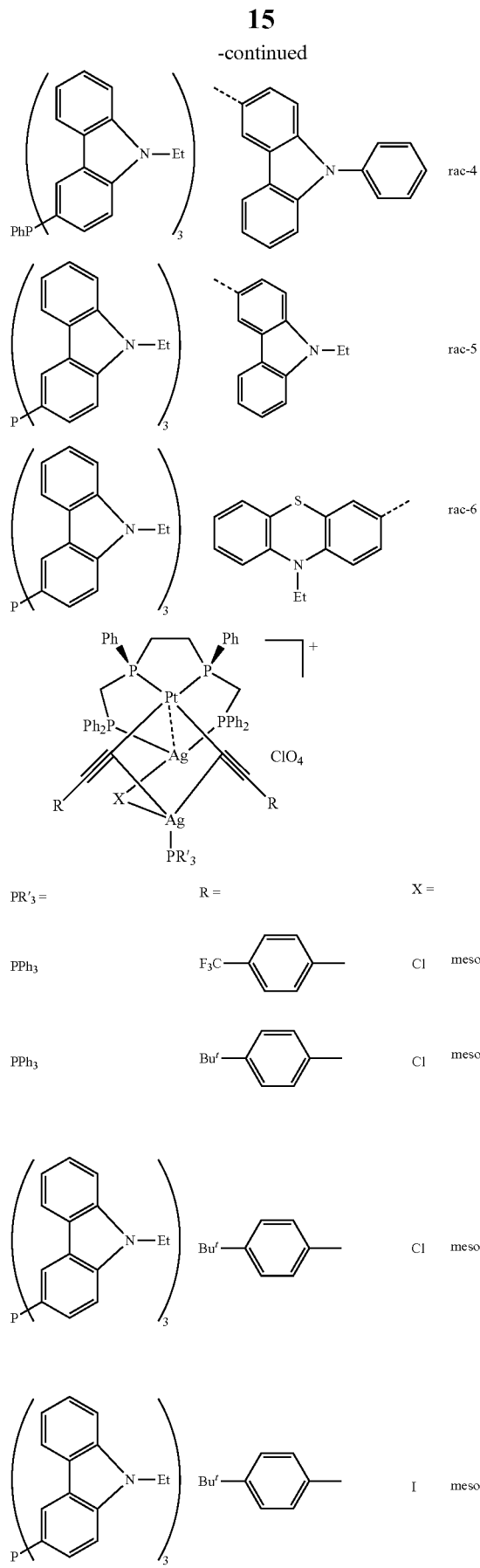

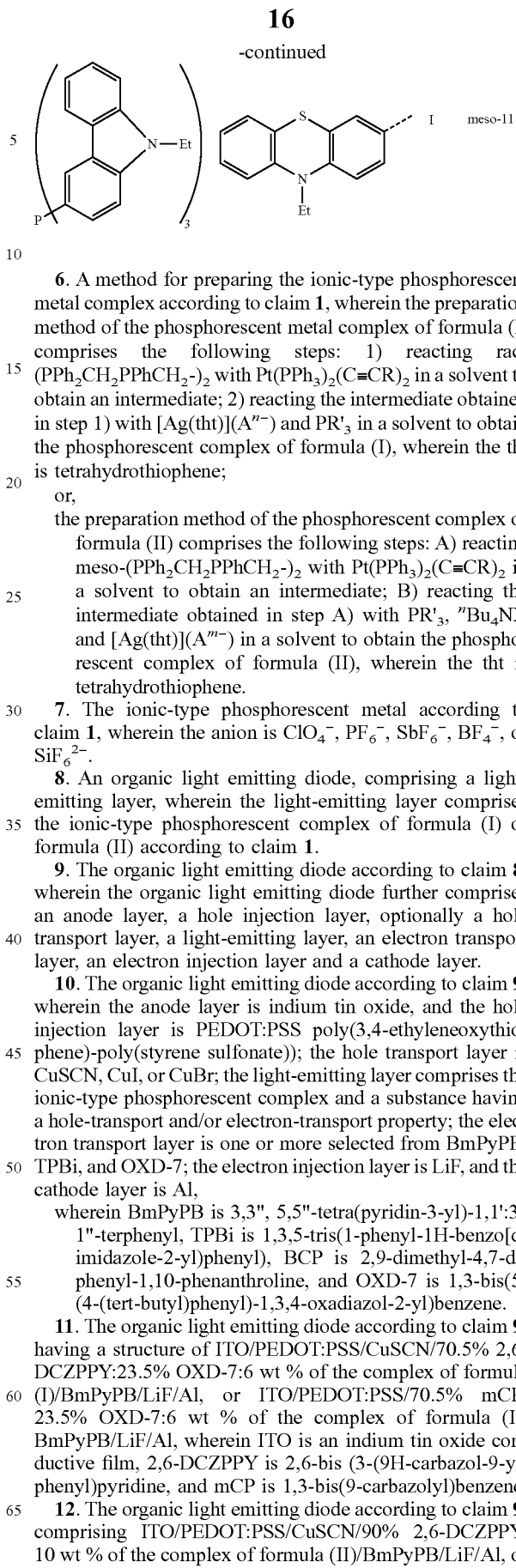

6. A method for preparing the ionic-type phosphorescent metal complex according to claim 1, wherein the preparation method of the phosphorescent metal complex of formula (I) comprises the following steps: 1) reacting rac-$(PPh_2CH_2PPhCH_2-)_2$ with $Pt(PPh_3)_2(C\equiv CR)_2$ in a solvent to obtain an intermediate; 2) reacting the intermediate obtained in step 1) with $[Ag(tht)](A^{n-})$ and $PR'_3$ in a solvent to obtain the phosphorescent complex of formula (I), wherein the tht is tetrahydrothiophene;

or, the preparation method of the phosphorescent complex of formula (II) comprises the following steps: A) reacting meso-$(PPh_2CH_2PPhCH_2-)_2$ with $Pt(PPh_3)_2(C\equiv CR)_2$ in a solvent to obtain an intermediate; B) reacting the intermediate obtained in step A) with $PR'_3$, $^nBu_4NX$ and $[Ag(tht)](A^{m-})$ in a solvent to obtain the phosphorescent complex of formula (II), wherein the tht is tetrahydrothiophene.

7. The ionic-type phosphorescent metal according to claim 1, wherein the anion is $ClO_4^-$, $PF_6^-$, $SbF_6^-$, $BF_4^-$, or $SiF_6^{2-}$.

8. An organic light emitting diode, comprising a light-emitting layer, wherein the light-emitting layer comprises the ionic-type phosphorescent complex of formula (I) or formula (II) according to claim 1.

9. The organic light emitting diode according to claim 8, wherein the organic light emitting diode further comprises an anode layer, a hole injection layer, optionally a hole transport layer, a light-emitting layer, an electron transport layer, an electron injection layer and a cathode layer.

10. The organic light emitting diode according to claim 9, wherein the anode layer is indium tin oxide, and the hole injection layer is PEDOT:PSS poly(3,4-ethyleneoxythiophene)-poly(styrene sulfonate)); the hole transport layer is CuSCN, CuI, or CuBr; the light-emitting layer comprises the ionic-type phosphorescent complex and a substance having a hole-transport and/or electron-transport property; the electron transport layer is one or more selected from BmPyPB, TPBi, and OXD-7; the electron injection layer is LiF, and the cathode layer is Al, wherein BmPyPB is 3,3", 5,5"-tetra(pyridin-3-yl)-1,1':3', 1"-terphenyl, TPBi is 1,3,5-tris(1-phenyl-1H-benzo[d] imidazole-2-yl)phenyl), BCP is 2,9-dimethyl-4,7-diphenyl-1,10-phenanthroline, and OXD-7 is 1,3-bis(5-(4-(tert-butyl)phenyl)-1,3,4-oxadiazol-2-yl)benzene.

11. The organic light emitting diode according to claim 9, having a structure of ITO/PEDOT:PSS/CuSCN/70.5% 2,6-DCZPPY:23.5% OXD-7:6 wt % of the complex of formula (I)/BmPyPB/LiF/Al, or ITO/PEDOT:PSS/70.5% mCP: 23.5% OXD-7:6 wt % of the complex of formula (I)/ BmPyPB/LiF/Al, wherein ITO is an indium tin oxide conductive film, 2,6-DCZPPY is 2,6-bis (3-(9H-carbazol-9-yl) phenyl)pyridine, and mCP is 1,3-bis(9-carbazolyl)benzene.

12. The organic light emitting diode according to claim 9, comprising ITO/PEDOT:PSS/CuSCN/90% 2,6-DCZPPY: 10 wt % of the complex of formula (II)/BmPyPB/LiF/Al, or ITO/PEDOT:PSS/90% mCP: 10 wt % of the complex of formula (II)/BmPyPB/LiF/Al, wherein ITO is an indium tin oxide conductive film, 2,6-DCZPPY is 2,6-bis (3-(9H-carbazol-9-yl)phenyl)pyridine, and mCP is 1,3-bis(9-carbazolyl)benzene.

13. The organic light emitting diode of claim 8, wherein, the phosphorescent complex of formula (I) accounts for 3-20% percentage by weight of a total weight of the light emitting layer.

14. The organic light emitting diode of claim 8, wherein the phosphorescent complex of formula (II) accounts for 5-25% percentage by weight of a total weight of the light emitting layer.

* * * * *